United States Patent
Yang et al.

(10) Patent No.: US 11,296,711 B2
(45) Date of Patent: Apr. 5, 2022

(54) CLOCK CONTROL DEVICE AND CLOCK CONTROL METHOD

(71) Applicant: REALTEK SEMICONDUCTOR CORPORATION, Hsinchu (TW)

(72) Inventors: Jun Yang, Suzhou (CN); Jia-Ning Lou, Suzhou (CN); Zhi-Xian Gao, Suzhou (CN); Jian Liu, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/228,764

(22) Filed: Apr. 13, 2021

(65) Prior Publication Data

US 2022/0029629 A1   Jan. 27, 2022

(30) Foreign Application Priority Data

Jul. 24, 2020   (CN) .......................... 202010724842.7

(51) Int. Cl.
*H04L 7/00* (2006.01)
*H03L 7/099* (2006.01)
*H03L 7/08* (2006.01)

(52) U.S. Cl.
CPC .......... *H03L 7/0998* (2013.01); *H04L 7/0025* (2013.01); *H03L 7/0807* (2013.01)

(58) Field of Classification Search
CPC .... H03L 7/0998; H03L 7/0807; H04L 7/0025
See application file for complete search history.

(56) References Cited

U.S. PATENT DOCUMENTS

| | | | | |
|---|---|---|---|---|
| 9,148,192 | B1* | 9/2015 | Wong | H04L 25/14 |
| 2007/0160173 | A1* | 7/2007 | Takeuchi | H03L 7/0814 |
| | | | | 375/355 |
| 2018/0278406 | A1* | 9/2018 | Palusa | H04L 7/0025 |
| 2019/0081772 | A1* | 3/2019 | Gao | H04L 27/148 |
| 2019/0089520 | A1* | 3/2019 | Dvir | H04L 7/0079 |
| 2021/0313993 | A1* | 10/2021 | Bai | H03L 7/0807 |

OTHER PUBLICATIONS

M. Y. He and J. Poulton, "A CMOS mixed-signal clock and data recovery circuit for OIF CEI-6G+ backplane transceiver," Mar. 2006, pp. 597-606, vol. 41, No. 3, in IEEE Journal of Solid-State Circuits.

(Continued)

*Primary Examiner* — Dac V Ha
(74) *Attorney, Agent, or Firm* — WPAT, PC

(57) ABSTRACT

A clock device includes a first phase interpolator circuit, a detector circuit, and a digital controller circuitry. The first phase interpolator circuit generates a second reference clock signal according to a first control signal and at least one first reference clock signal. The detector circuit generates an error signal according to a difference between a receiver signal and the second reference clock signal, in which the receiver signal is a receiver clock signal from a receiver circuit or an input signal that has been equalized by the receiver circuit. The digital controller circuitry generates the first control signal and a second control signal according to the error signal, and updates the second control signal according to a change of the first control signal, in which the second control signal is for generating a transmitter clock signal of a transmitter circuit.

20 Claims, 7 Drawing Sheets

(56) References Cited

OTHER PUBLICATIONS

K. Ishii, K. Kishine and H. Ichino, "A jitter suppression technique for a 2.48832 Gb/s clock and data recovery circuit," Apr. 2002, vol. 49, No. 4, pp. 266-272, IEEE Transactions on Circuits and Systems—II: Analog and Digital Signal Processing, 2000 IEEE International Symposium.

Apple Inc. et al., Universal Serial Bus 3.2 Specification, The USB 3.2 Specification released on Sep. 22, 2017, USB 3.0 Promoter Group.

* cited by examiner

CLOCK CONTROL DEVICE AND CLOCK CONTROL METHOD

BACKGROUND

1. Technical Field

The present disclosure relates to a clock control device. More particularly, the present disclosure relates to a clock control device and a clock control method applied to a serializer/deserializer interface.

2. Background

With increase in data rate, a high-speed data transmission interface suffers higher input signal attenuation and intersymbol interference, such that a receiver end cannot receive correct signal(s). In some related approaches, a re-timer is utilized to retime a signal to be outputted, such that the receiver end may receive correct signal(s). However, in these approaches, the output signal may have jitter(s) due to the re-timer. In order to suppress the jitter(s), a loop filter having larger area is required to be employed by the receiver end for filtering operation, which results in a significant increase in overall costs.

SUMMARY

In some aspects of the present disclosure, a clock device includes a first phase interpolator circuit, a detector circuit, and a digital controller circuitry. The first phase interpolator circuit is configured to generate a second reference clock signal according to a first control signal and at least one first reference clock signal. The detector circuit is configured to generate an error signal according to a first difference between a receiver signal and the second reference clock signal, wherein the receiver signal is a receiver clock signal from a receiver circuit or an input signal that has been equalized by the receiver circuit. The digital controller circuitry is configured to generate the first control signal and a second control signal according to the error signal, and to update the second control signal according to a change of the first control signal, wherein the second control signal is for generating a transmitter clock signal of a transmitter circuit.

In some aspects of the present disclosure, a clock control method includes the following operations: generating a second reference clock signal according to a first control signal and at least one first reference clock signal; generating an error signal according to a first difference between a receiver signal and the second reference clock signal, wherein the receiver signal is a receiver clock signal from a receiver circuit or an input signal that has been equalized by the receiver circuit; and generating the first control signal and a second control signal according to the error signal, and updating the second control signal according to a change of the first control signal, wherein the second control signal is for generating a transmitter clock signal of a transmitter circuit.

These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
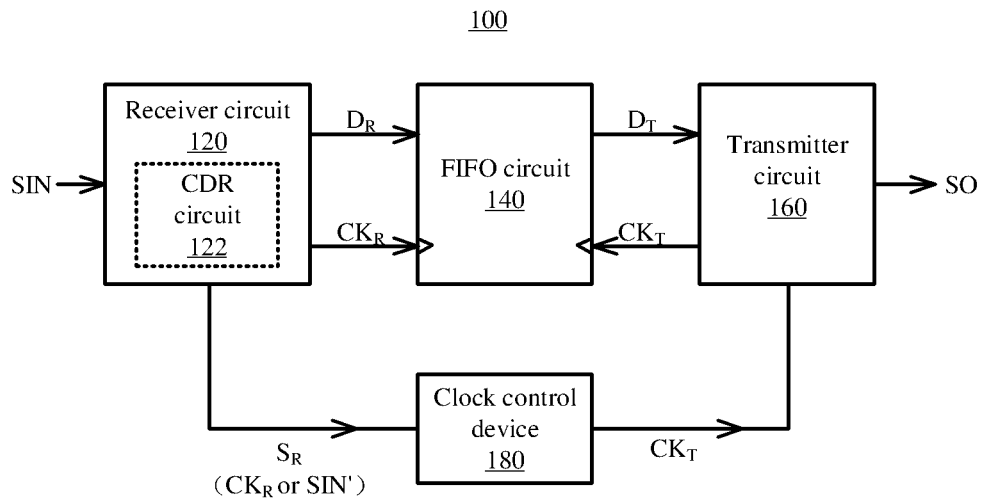
FIG. 1 is a schematic diagram of a data transmission system according to some embodiments of the present disclosure.

FIG. 1 is a schematic diagram of a data transmission system 100 according to some embodiments of the present disclosure. In some embodiments, the data transmission system 100 may be applied in a serializer/deserializer (SerDes) interface. The data transmission system 100 includes a receiver circuit 120, a first in first output (FIFO) circuit 140 (hereinafter referred to as "the FIFO circuit 140" for simplicity), a transmitter circuit 160, and a clock control device 180.

The receiver circuit 120 receives an input signal SIN according to a receiver clock signal $CK_R$, and outputs a data signal $D_R$ and the receiver clock signal $CK_R$ to the FIFO circuit 140. The FIFO circuit 140 receives the data signal $D_R$ according to the receiver clock signal $CK_R$, and outputs the received data signal $D_R$ according to a transmitter clock signal $CK_T$ to be a data signal $D_T$. The transmitter circuit 160 outputs the data signal $D_T$ to be an output signal SO.

The clock control device 180 is coupled between the receiver circuit 120 and the transmitter circuit 160. In some embodiments, the clock control device 180 may be configured to generate the transmitter clock signal $CK_T$ according to a receiver signal $S_R$ from the receiver circuit 120. In some embodiments, the receiver circuit 120 may output the receiver clock signal $CK_R$ to be the receiver signal $S_R$. In some embodiments, the receiver circuit 120 may equalize the input signal SIN to be an input signal SIN', and output the input signal SIN' to be the receiver signal $S_R$.

The clock control device 180 may operate as a re-timer circuit to retime the output signal SO, in order to reduce impacts from signal attenuation and/or intersymbol interference. In some embodiments, the receiver clock signal $CK_R$ may be generated from a clock and data recovery circuit 122 (labeled as "CDR circuit 122") in the receiver circuit 120. As mentioned above, the receiver clock signal $CK_R$ may be outputted to be the receiver signal $S_R$. Alternatively, in some embodiments, the data transmission system 100 may further include a frequency divider circuit (not shown), which is configured to generate the receiver signal $S_R$ according to the receiver clock signal $CK_R$.

Figure 2A:
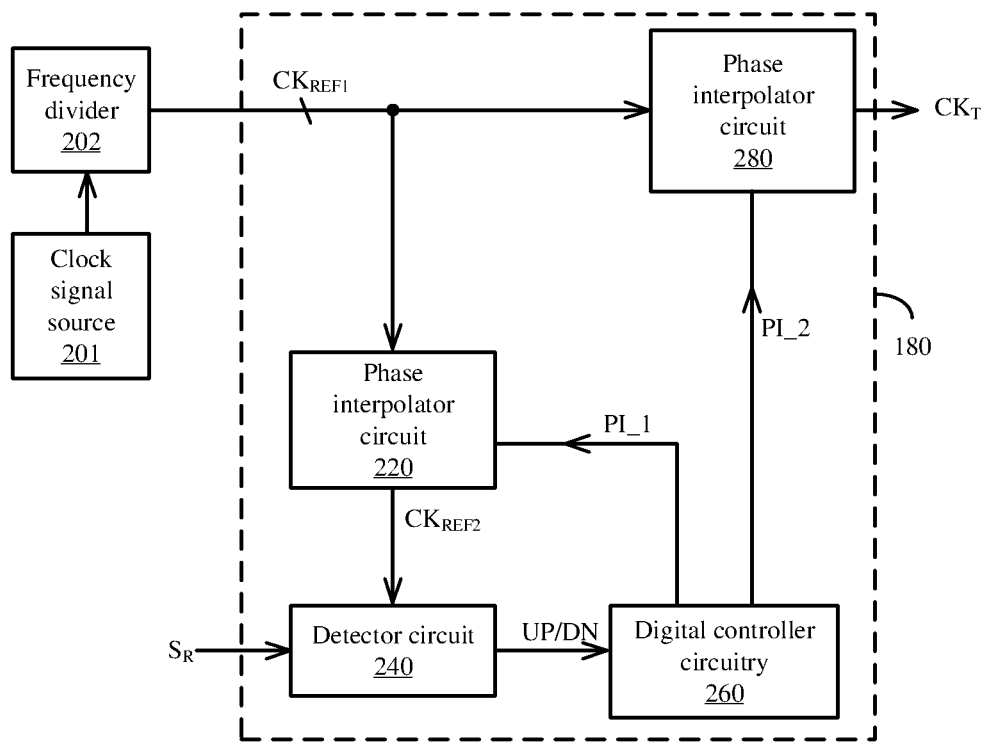
FIG. 2A is a schematic diagram of the clock control device in FIG. 1 according to some embodiments of the present disclosure.

FIG. 2A is a schematic diagram of the clock control device 180 in FIG. 1 according to some embodiments of the present disclosure. In some embodiments, the clock control device 180 includes a phase interpolator circuit 220, a detector circuit 240, and a digital controller circuitry 260.

The phase interpolator circuit 220 is configured to generate a reference clock signal $CK_{REF2}$ according to a control signal PI_1 and at least one reference clock signal $CK_{REF1}$. In this example, the at least one reference clock signal $CK_{REF1}$ may be clock signals having different phases, in which the clock signals are generated from the clock signal source 201 and the frequency divider circuit 202. The phase interpolator circuit 220 may select at least two signals from the at least one reference clock signal $CK_{REF1}$ according to the control signal PI_1 for interpolation, in order to generate the reference clock signal $CK_{REF2}$. In some embodiments, the clock signal source 201 may be, but not limited to, a phase locked loop circuit, a crystal oscillator, or a LC tank circuit. In some embodiments, the clock signal source 201 and the frequency divider circuit 202 are independent to the clock control device 180. In some other embodiments, the clock signal source 201 and the frequency divider circuit 202 may be integrated to the clock control device 180. In some other embodiments, the frequency divider circuit 202 in FIG. 2A is optional. That is, the frequency divider circuit 202 may be selectively employed according to practical requirements (which may be applicable to embodiments in FIG. 2B, 3B, or 4C as well).

In some embodiments, the phase interpolator circuit 220 includes input pairs circuits (not shown in the figure) and a current source circuit (not shown in the figure). The input pair circuits are coupled to the current source circuit and are selectively turned on according to the at least one reference clock signal $CK_{REF1}$. The current source circuit includes switches that are selectively turned on according to the control signal PI_1, in order to determine a ratio of a current flowing through the input pair circuits. As a result, the input pair circuits may perform the interpolation to generate the corresponding reference clock signal $CK_{REF2}$ according to the ratio and the at least one reference clock signal $CK_{REF1}$. The above implementations of the phase interpolator circuit 220 are given for illustrative purposes, and the present disclosure is not limited thereto. Various types of the phase interpolator circuit 220 are within the contemplated scope of the present disclosure.

The detector circuit 240 is configured to generate an error signal UP/DN according to a difference between the receiver signal $S_R$ and the reference clock signal $CK_{REF2}$. In some embodiments, the detector circuit 240 may be a phase detector circuit, a frequency detector circuit, or a phase frequency detector circuit, which may be configured to detect the difference between a frequency (or a phase) of the receiver signal $S_R$ and that of the reference clock signal $CK_{REF2}$, and to output the error signal UP/DN accordingly. The digital controller circuitry 260 is configured to generate the control signal PI_1 and the control signal PI_2 according to the error signal UP/DN, and to update the control signal PI_2 based on a change of the control signal PI_1. In some embodiments, the digital controller circuitry 260 may be configured to reduce an update rate of the transmitter clock signal $CK_T$, in order to suppress jitters on the transmitter clock signal $CK_T$. Detailed arrangements about the digital controller circuitry 260 will be given with reference to FIG. 2C.

In this example, the clock control device 180 further includes a phase interpolator circuit 280. The phase interpolator circuit 280 is configured to generate the transmitter clock signal $CK_T$ according to the control signal PI_2 and the at least one reference clock signal $CK_{REF1}$. Similar to the phase interpolator circuit 220, the phase interpolator circuit 280 may select at least two signals from the at least one reference clock signal $CK_{REF1}$ according to the control signal PI_2, in order to generate the transmitter clock signal $CK_T$.

By updating the control signal PI_1, the reference clock signal $CK_{REF2}$ may be the same as (or close to) the receiver signal $S_R$. It is understood that, if the control signal PI_2 is the same as (or close to) the control signal PI_1 and the phase interpolator circuit 220 and the phase interpolator circuit 280 have the same circuit configurations, the transmitter clock signal $CK_T$ will be the same as (or close to) the reference clock signal $CK_{REF2}$ as well. Therefore, with the configuration of utilizing the control signal PI_2 to track the control signal PI_1, the transmitter clock signal $CK_T$ may be synchronized with the receiver signal $S_R$.

As mentioned above, the receiver signal $S_R$ may be the receiver clock signal $CK_R$ or the input signal SIN' that has been equalized. In some embodiments, if the receiver signal $S_R$ is set to be the input signal SIN', operations of the phase interpolator circuit 220, the detector circuit 240, and the digital controller circuitry 260 are equivalent to the clock and data recovery circuit 122, and are thus able to generate the reference clock signal $CK_{REF2}$ for reading the input signal SIN. That is, in some other embodiments, the clock and data recovery circuit 122 of the receiver circuit 120 in FIG. 1 is optional. For example, if the clock and data recovery circuit 122 is not employed in the receiver circuit 120, the reference clock signal $CK_{REF2}$ of the clock control device 180 in FIG. 2A may be the receiver clock signal $CK_R$ that is inputted to the FIFO circuit 140 (which may be, for example, transmitted to the FIFO circuit 140 via the receiver circuit 120, but the present disclosure is not limited thereto).

Figure 2B:
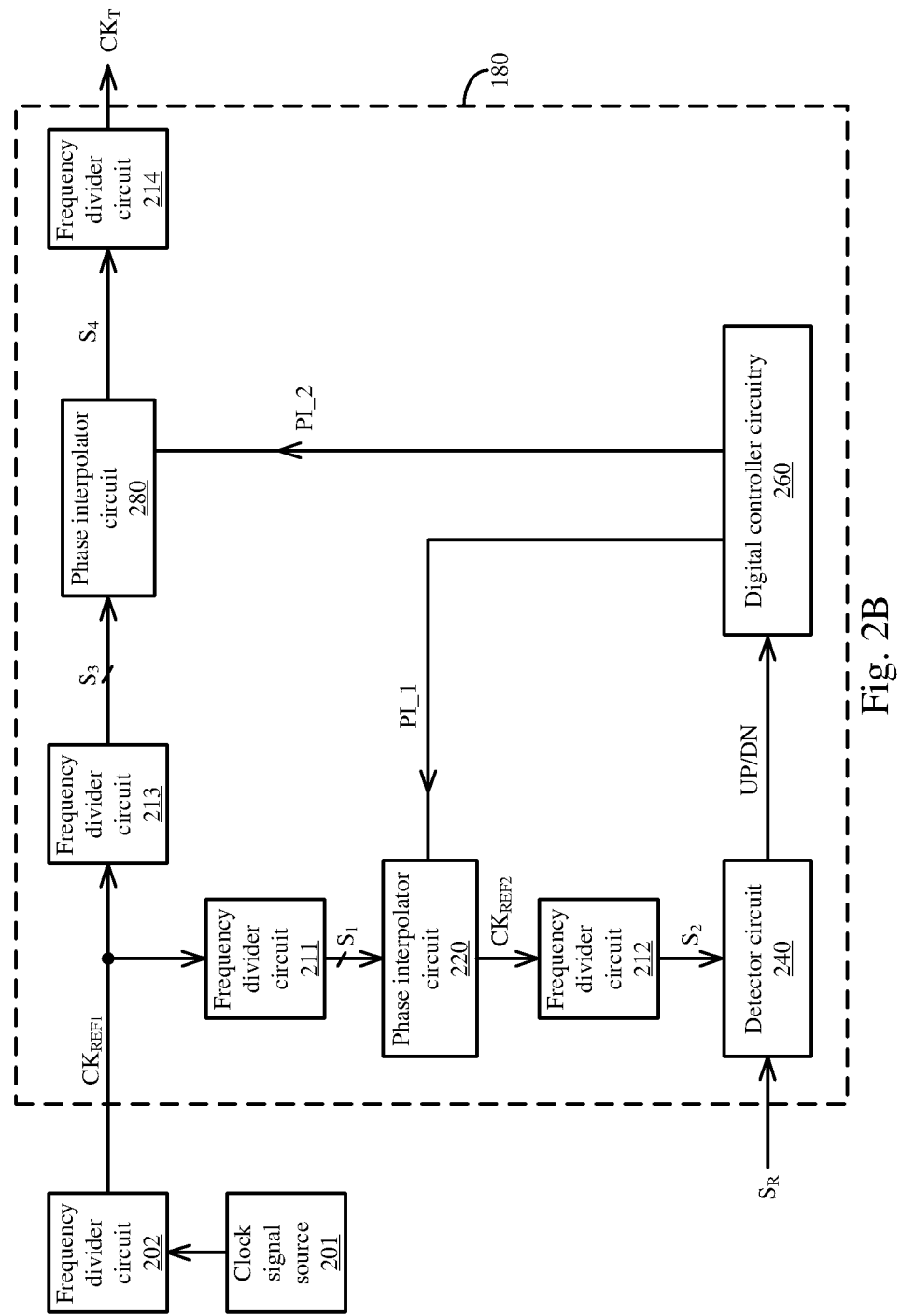
FIG. 2B is a schematic diagram of the clock control device in FIG. 1 according to some embodiments of the present disclosure.

FIG. 2B is a schematic diagram of the clock control device 180 in FIG. 1 according to some embodiments of the present disclosure. Compared with FIG. 2A, the clock control device 180 further includes more optional frequency divider circuits 211-214. In some embodiments, according to practical application requirements, at least one of the frequency divider circuits 211-214 may be employed. In some embodiments, a division ratio of each of the frequency divider circuits 211-214 is configurable. For example, the division ratio may be 1, 2, 3, and so on.

The frequency divider circuit 211 is configured to generate signals S according to the at least one reference clock signal $CK_{REF1}$. In this example, the at least one reference clock signal $CK_{REF1}$ may be a single clock signal, and the signals $S_1$ may be clock signals having different phases. The phase interpolator circuit 220 may generate the reference clock signal $CK_{REF2}$ according to the control signal PI_1 and the signals $S_1$. The frequency divider circuit 212 is configured to generate a signal $S_2$ according to the reference clock signal $CK_{REF2}$. The detector circuit 240 may generate the error signal UP/DN according to a difference between the receiver signal $S_R$ and signal $S_2$. The frequency divider circuit 213 is configured to generate signal $S_3$ according to the at least one reference clock signal $CK_{REF1}$. Similar to the signals $S_1$, the signals $S_3$ may be clock signals having different phases. The phase interpolator circuit 280 may generate a signal $S_4$ according to the control signal PI_2 and the signals $S_3$. The frequency divider circuit 214 may generate the transmitter clock signal $CK_T$ according to the signal $S_4$.

It is understood that, the arrangements shown in FIG. 2A and FIG. 2B can be adjusted flexibly according to practical applications, and thus the present disclosure is not limited to FIG. 2A and FIG. 2B. For example, if the frequency divider circuits 211 and 213 are not employed, the at least one reference clock signal $CK_{REF1}$ may be clock signals having different phases and may be inputted to the phase interpolator circuit 220 and the phase interpolator circuit 280 directly. Similarly, if the frequency divider circuit 212 is not employed, the reference clock signal $CK_{REF2}$ may be inputted to the detector circuit 240 directly. With this analogy, the alternative arrangements included in FIG. 2A and FIG. 2B should be understood.

Figure 2C:
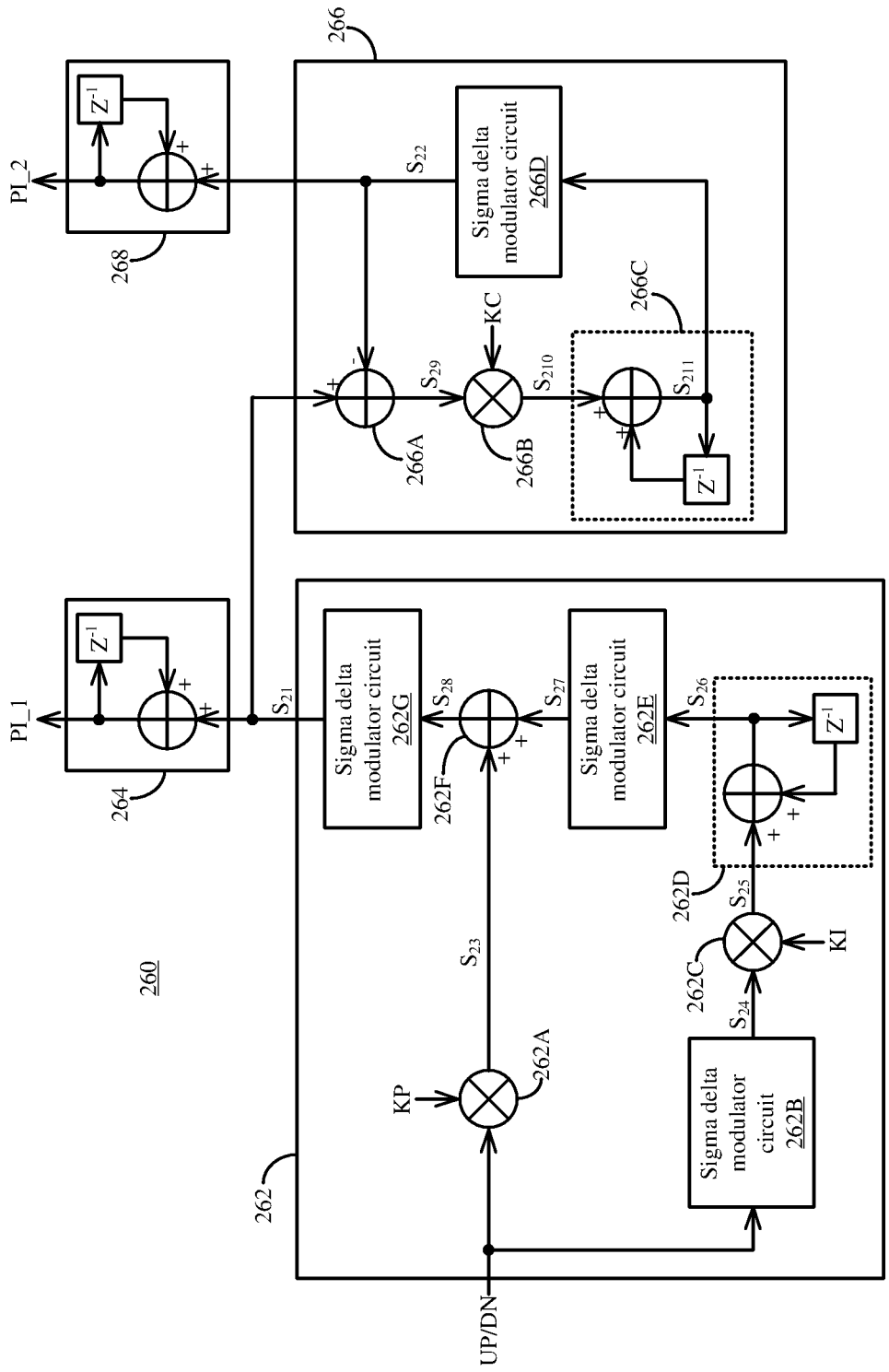
FIG. 2C is schematic diagram of the digital controller circuitry in FIG. 2A or FIG. 2B according to some embodiments of the present disclosure.

FIG. 2C is schematic diagram of the digital controller circuitry 260 in FIG. 2A or FIG. 2B according to some embodiments of the present disclosure. The digital controller circuitry 260 includes a filter circuit 262, an integrator circuit 264, a filter circuit 266, and an integrator circuit 268. The filter circuit 262 is configured to filter the error signal UP/DN to generate a signal $S_{21}$. The integrator circuit 264 is configured to accumulate the signal $S_{21}$ to generate the control signal PI_1. The filter circuit 266 is configured to filter a difference between the signal $S_{21}$ and a signal $S_{22}$, in order to generate the signal $S_{22}$. The integrator circuit 268 is configured to accumulate the signal $S_{22}$, in order to generate the control signal PI_2.

In some embodiments, the filter circuit 262 includes a multiplier circuit 262A, a sigma delta modulator circuit 262B, a multiplier circuit 262C, a sub-integrator circuit 262D, a sigma delta modulator circuit 262E, an adder circuit 262F, and a sigma delta modulator circuit 262G. The multiplier circuit 262A is configured to multiply a coefficient KP with the error signal UP/DN, in order to generate a signal $S_{23}$. The sigma delta modulator circuit 262B is configured to modulate the error signal UP/DN to generate a signal $S_{24}$. The multiplier circuit 262C is configured to multiply a coefficient KI with the signal $S_{24}$, in order to generate a signal $S_{25}$. The sub-integrator circuit 262D is configured to accumulate the signal $S_{25}$, in order to generate a signal Sm. The sigma delta modulator circuit 262E is configured to modulate the signal Sm, in order to generate a signal $S_{27}$. The adder circuit 262F is configured to sum up the signal $S_{27}$ and the signal $S_{23}$, in order to generate a signal $S_{28}$. The sigma delta modulator circuit 262G is configured to modulate the signal $S_{28}$, in order to generate the signal $S_{21}$.

With the above configuration, the filter circuit 262 is a second-order circuit. A first-order signal path (which includes the multiplier circuit 262A, the adder circuit 262F, and the sigma delta modulator circuit 262G) may track a phase error, and a second-order signal path (which includes the sigma delta modulator circuit 262B, the multiplier circuit 262C, the sub-integrator circuit 262D, and the sigma delta modulator circuit 262E) may track a frequency error. Furthermore, with the modulation and the accumulation of the second-order signal path, the high frequency noises and the update rate of the control signal PI_1 in a period of time can be decreased. As a result, the update rate of the transmitter clock signal $CK_T$ can be decreased, in order to suppress jitters on the transmitter clock signal $CK_T$.

In some embodiments, the filter circuit 266 is configured to subtract the signal $S_{22}$ from the signal $S_{21}$, in order to determine a difference (e.g., a signal $S_{29}$) between the signal $S_{21}$ and the signal $S_{22}$, and to update the signal $S_{22}$ according to the difference. Equivalently, the filter circuit 266 may update the control signal PI_2 based on the change of the control signal PI_1. The filter circuit 266 may include a subtractor circuit 266A, a multiplier circuit 266B, a sub-integrator circuit 266C, and a sigma delta modulator circuit 266D. The subtractor circuit 266A subtracts the signal $S_{22}$ from the signal $S_{21}$, in order to generate the signal $S_{29}$. The multiplier circuit 266B multiplies a coefficient KC with the signal $S_{29}$, in order to generate a signal $S_{210}$. The sub-integrator circuit 266C is configured to accumulate the signal $S_{210}$, in order to generate a signal $S_{211}$. The sigma delta modulator circuit 266D is configured to modulate the signal $S_{211}$ to generate the signal $S_{22}$. In some embodiments, the coefficient KP, the coefficient KI, and the coefficient KC are configurable filter coefficients, which may set gain, bandwidth, or the like of the digital controller circuitry 260.

Similar to the filter circuit 262, with the modulation and the accumulation of the filter circuit 266, the high frequency noises and the update rate of the control signal PI_2 in a period of time can be decreased. As a result, the update rate of the transmitter clock signal $CK_T$ may be decreased, in order to suppress jitters on the transmitter clock signal $CK_T$.

In some embodiments, each of the integrator circuit 264, the integrator circuit 268, the sub-integrator circuit 262D, and the sub-integrator circuit 266C may be implemented with an adder circuit and a delay circuit (which is labeled as "$Z^{-1}$"). In one or more embodiments, each one of the sigma delta modulator circuit 262B, the sigma delta modulator circuit 262E, the sigma delta modulator circuit 262G, and the sigma delta modulator circuit 266D may be selectively employed. For example, if the sigma delta modulator circuit 262B is not employed, the error signal UP/DN may be directly inputted to the multiplier circuit 266B, and the multiplier circuit 266B may multiply the coefficient KI with the error signal UP/DN to generate the signal $S_{25}$. With this analogy, it is understood that the digital controller circuitry of FIG. 2C can have various structures with flexibility.

Alternatively, in one or more embodiments, each of the sigma delta modulator circuit 262B, the sigma delta modulator circuit 262E, the sigma delta modulator circuit 262G, and the sigma delta modulator circuit 266D may operate in a bypass mode and a modulation mode. When operating in the bypass mode, a corresponding sigma delta modulator circuit directly outputs an input signal to be an output signal. When operating in the modulation mode, the corresponding sigma delta modulator circuit modulates the received input signal to generate the output signal. Taking the sigma delta modulator circuit 262B as an example, when operating in the bypass mode, the sigma delta modulator circuit 262B directly outputs the error signal UP/DN to be the signal $S_{24}$. Alternatively, when operating in the modulation mode, the sigma delta modulator circuit 262B modulates the error signal UP/DN to generate the signal $S_{24}$. With this analogy, it is understood that the digital controller circuitry of FIG. 2C can have various operations with flexibility.

Figure 3A:
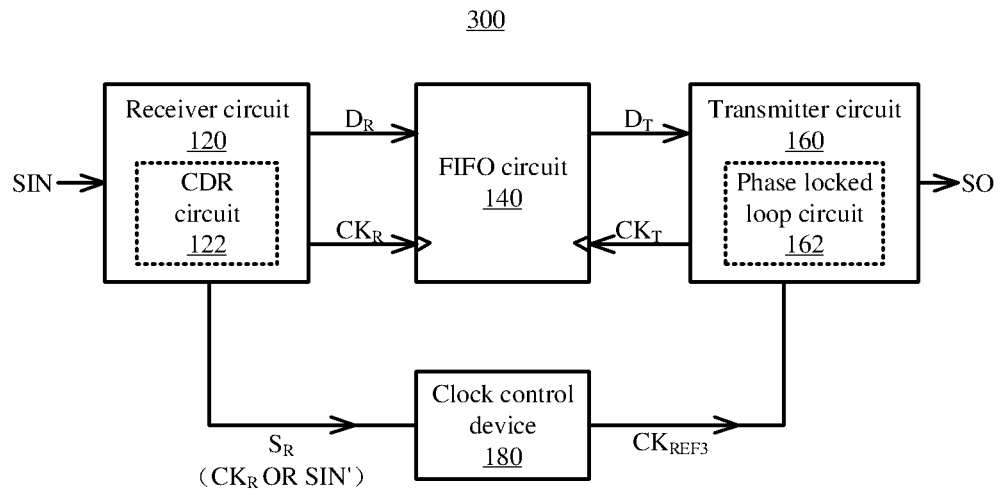
FIG. 3A is a schematic diagram of a data transmission system according to some embodiments of the present disclosure.

FIG. 3A is a schematic diagram of a data transmission system 300 according to some embodiments of the present disclosure. Compared to FIG. 1, the clock control device 180 outputs a reference clock signal $CK_{REF3}$, and the transmitter circuit 160 further includes a phase locked loop circuit 162. The phase locked loop circuit 162 is configured to generate the transmitter clock signal $CK_T$ according to the reference clock signal $CK_{REF3}$. In these embodiments, the reference clock signal $CK_{REF3}$ may be a reference signal (e.g., a reference signal FREF in FIG. 4B) of the phase locked loop circuit 162. Similar to the previous embodiments, if the clock and data recovery circuit 122 is not employed in the receiver circuit 120 of FIG. 3A, the reference clock signal $CK_{REF2}$ of the clock control device 180 in FIG. 3B may be outputted to be the receiver clock signal $CK_R$.

Figure 3B:
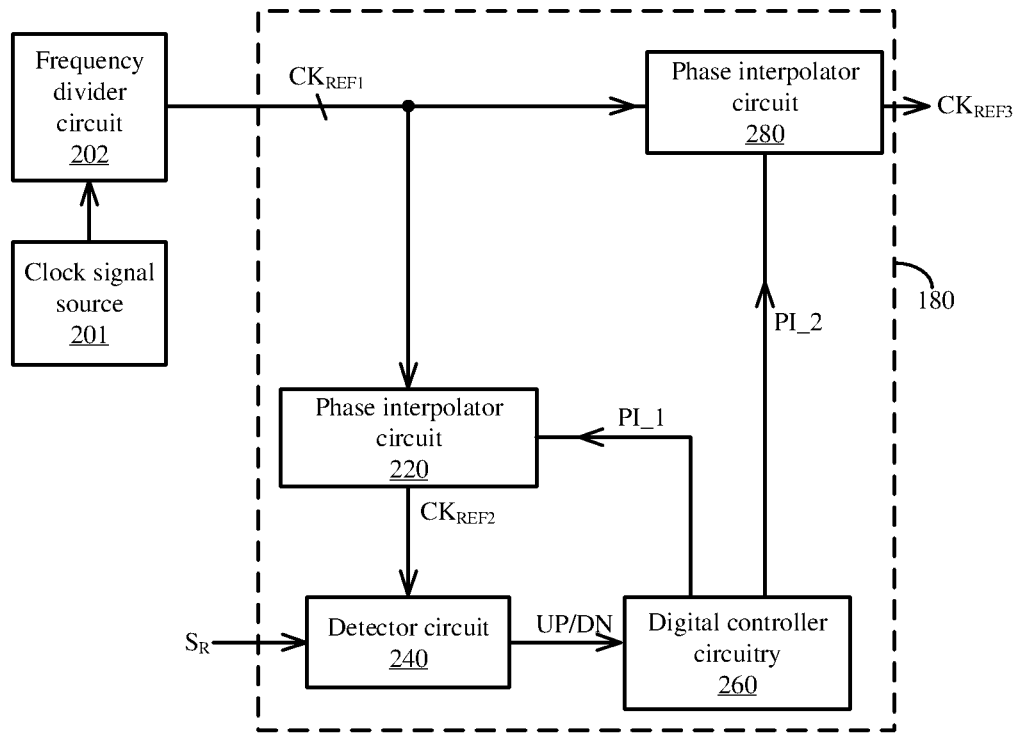
FIG. 3B is a schematic diagram of the clock control device in FIG. 3A according to some embodiments of the present disclosure.

FIG. 3B is a schematic diagram of the clock control device 180 in FIG. 3A according to some embodiments of the present disclosure. Compared to FIG. 2A or FIG. 2B, the phase interpolator circuit 280 is configured to generate the reference clock signal $CK_{REF3}$ according to the control signal PI_2 and the at least one reference clock signal $CK_{REF1}$.

Figure 4A:
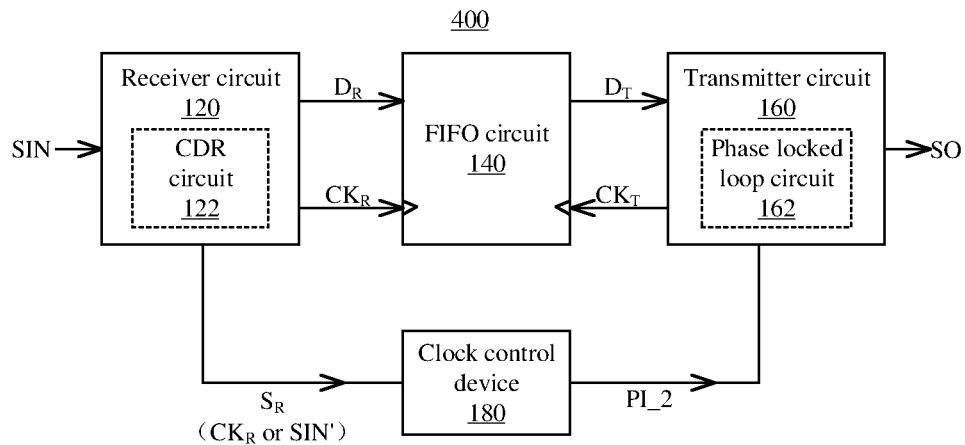
FIG. 4A is a schematic diagram of a data transmission system according to some embodiments of the present disclosure.

FIG. 4A is a schematic diagram of a data transmission system 400 according to some embodiments of the present disclosure. Compared to the data transmission system 100 in FIG. 1, the transmitter circuit 160 further includes the phase locked loop circuit 162, which is configured to generate the transmitter clock signal $CK_T$ according to the control signal PI_2 generated from the clock control device 180. Similar to the previous embodiments, if the clock and data recovery circuit 122 is not employed in the receiver circuit 120 of FIG. 4A, the reference clock signal $CK_{REF2}$ of the clock control device 180 in FIG. 4C may be outputted to be the receiver clock signal $CK_R$.

Figure 4B:
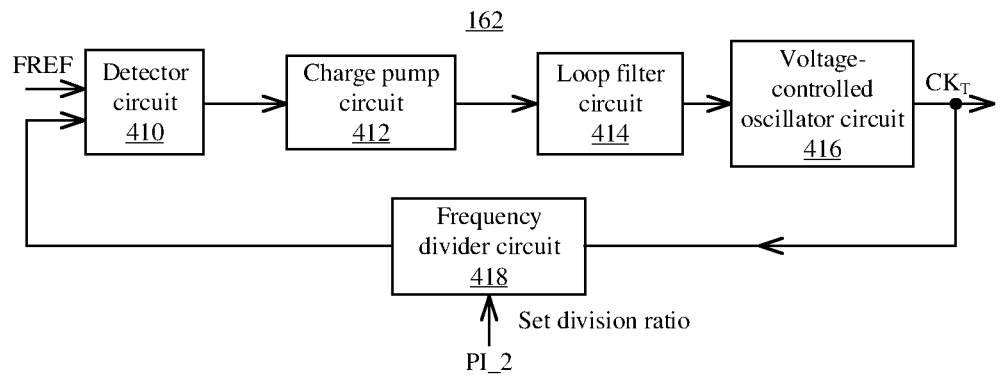
FIG. 4B is a schematic diagram of the phase locked loop circuit in FIG. 4A according to some embodiments of the present disclosure.

FIG. 4B is a schematic diagram of the phase locked loop circuit 162 in FIG. 4A according to some embodiments of the present disclosure. The phase locked loop circuit 162 includes a detector circuit 410, a charge pump circuit 412, a loop filter circuit 414, a voltage-controlled oscillator circuit 416, and a frequency divider circuit 418. The detector circuit 410 is configured to detect a difference between the reference signal FREF and an output signal (not shown in the figure) of the frequency divider circuit 418, in order to generate a corresponding error signal (not shown in the figure). The charge pump circuit 412 may perform a charging operation or a discharging operation according to this error signal (not shown in the figure), in order to generate a control voltage (not shown in the figure). The loop filter circuit 414 may filter this control voltage to generate an adjustment voltage (not shown in the figure). The voltage-controlled oscillator circuit 416 may generate the corresponding transmitter clock signal $CK_T$ according to this adjustment voltage. The frequency divider circuit 418 may perform a frequency dividing operation on the transmitter clock signal $CK_T$ according to the control signal PI_2, in order to generate the output signal (not shown in the figure) and to transmit the same to the detector circuit 410, in which the frequency divider circuit 418 may set its division ratio according to the control signal PI_2.

Figure 4C:
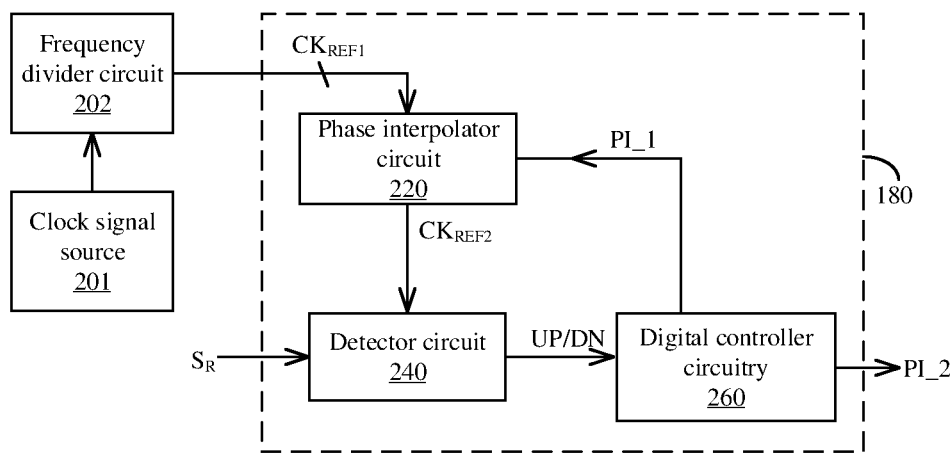
FIG. 4C is a schematic diagram of the clock control device in FIG. 4A according to some embodiments of the present disclosure.

FIG. 4C is a schematic diagram of the clock control device 180 in FIG. 4A according to some embodiments of the present disclosure. Compared to FIG. 2A or FIG. 2B, the phase interpolator circuit 280 is not employed in the clock control device 180 in FIG. 4C, and the clock control device 180 may directly output the control signal PI_2 to the frequency divider circuit 418 in FIG. 4B.

Figure 4D:
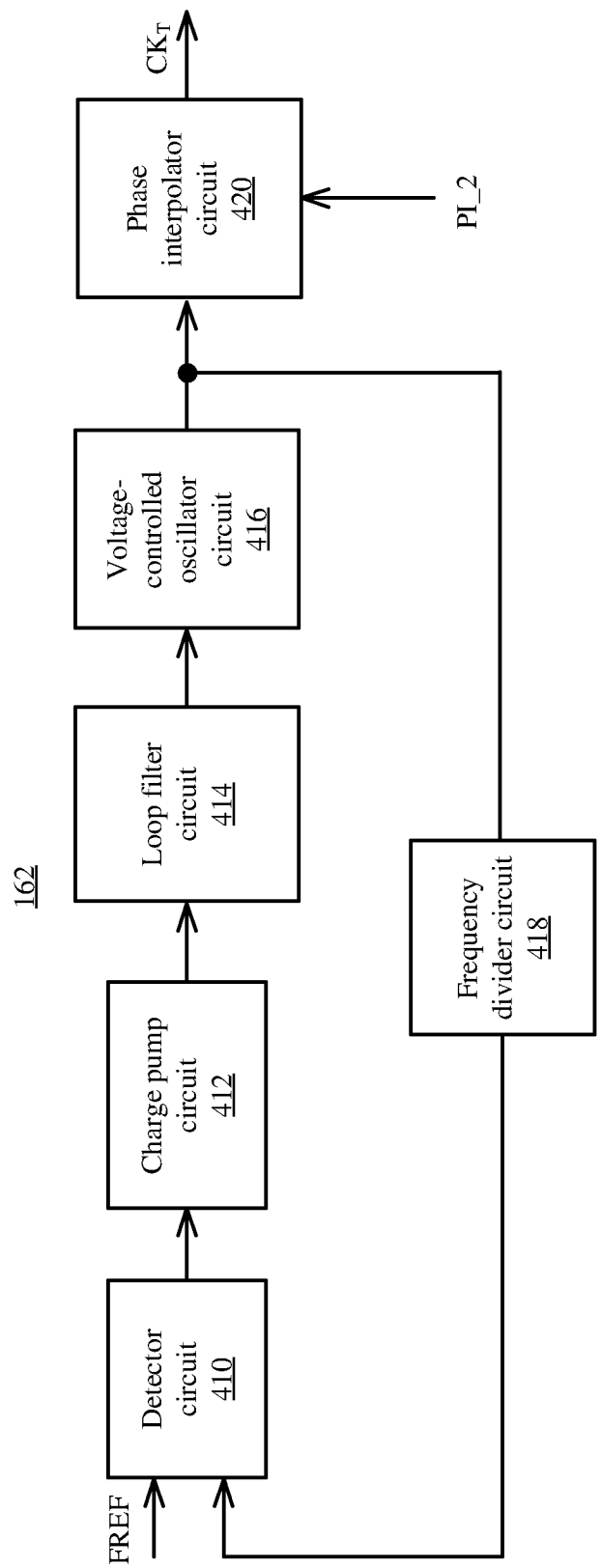
FIG. 4D is a schematic diagram of the phase locked loop circuit in FIG. 4A according to some embodiments of the present disclosure.

FIG. 4D is a schematic diagram of the phase locked loop circuit 162 in FIG. 4A according to some embodiments of the present disclosure. Compared to FIG. 4B, the phase locked loop circuit 162 further includes a phase interpolator circuit 420. In this example, the voltage-controlled oscillator circuit 416 generate clock signals (not shown in the figure) having different phases. The phase interpolator circuit 420 generates the transmitter clock signal $CK_T$ according to the control signal PI_2 and these clock signals.

The clock control device 180 shown in FIG. 3B and FIG. 4C may be given for illustrative purposes, and the present disclosure is not limited thereto. It is understood that, similar to FIG. 2B, in other embodiments, the clock control device 180 in FIG. 3B and FIG. 4C may selectively employ one or more frequency divider circuits (e.g., at least one of the frequency divider circuits 211-214).

Figure 5:
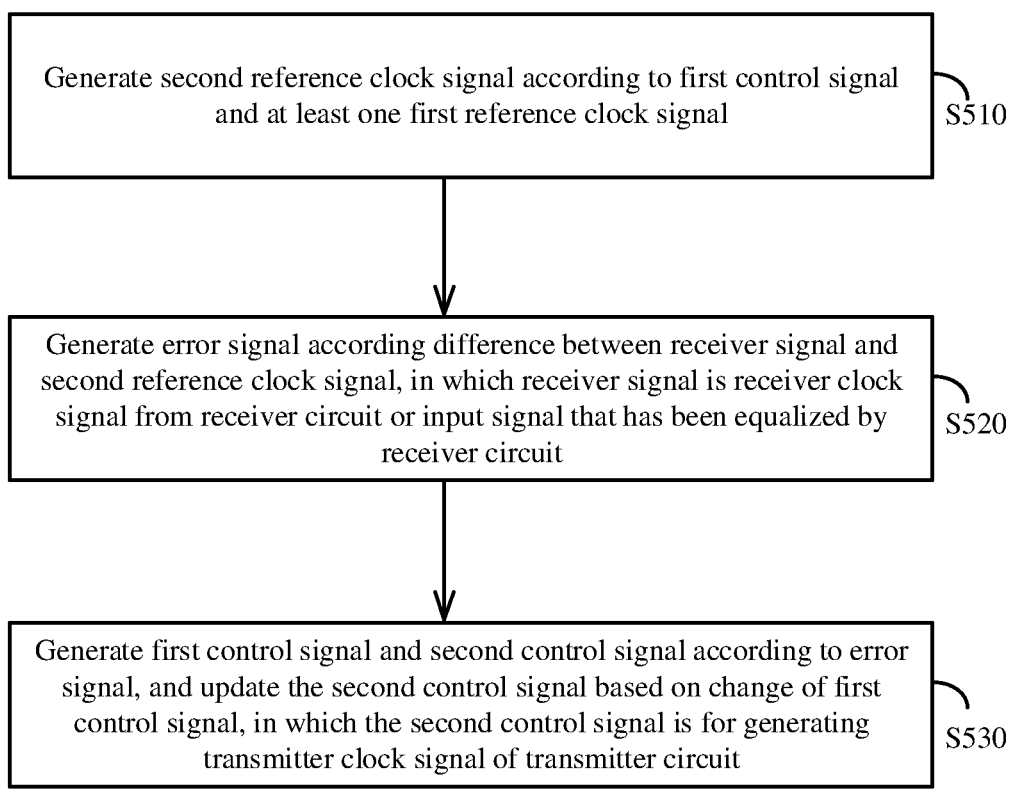
FIG. 5 is a flow chart of a clock control method according to some embodiments of the present disclosure.

FIG. 5 is a flow chart of a clock control method 500 according to some embodiments of the present disclosure. In operation S510, a second reference clock signal is generated according to a first control signal and at least one first reference clock signal. In operation S520, an error signal is generated according to a difference between a receiver signal and the second reference clock signal, in which the receiver signal is a receiver clock signal from a receiver circuit or the input signal that has been equalized by the receiver circuit. In operation S530, the first control signal and a second control signal are generated according to the error signal, and the second control signal is updated according to a change of the first control signal, in which the second control signal is for generating a transmitter clock signal of a transmitter circuit.

Operation S510, S520, and S530 can be understood with reference to various embodiments discussed above, and thus the repetitious descriptions are not given. The above description of the clock control method 500 includes exemplary operations, but the operations are not necessarily performed in the order described above. Operations of the clock control method 500 may be added, replaced, changed order, and/or eliminated as appropriate, or the operations are able to be executed simultaneously or partially simultaneously as appropriate, in accordance with the spirit and scope of various embodiments of the present disclosure.

As described above, with the clock control device and clock control method in some embodiments of the present disclosure, the transmitter clock signal device is able to be synchronized with the receiver clock signal, and jitters on the transmitter clock signal are able to be suppressed without employing a loop filter having large area.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A clock control device, comprising:
    a first phase interpolator circuit configured to generate a second reference clock signal according to a first control signal and at least one first reference clock signal;
    a detector circuit configured to generate an error signal according to a first difference between a receiver signal and the second reference clock signal, wherein the receiver signal is a receiver clock signal from a receiver circuit or an input signal that has been equalized by the receiver circuit; and
    a digital controller circuitry configured to generate the first control signal and a second control signal according to the error signal, and to update the second control signal according to a change of the first control signal, wherein the second control signal is for generating a transmitter clock signal of a transmitter circuit, and the digital controller circuitry is configured to reduce an update rate of the transmitter clock signal, in order to suppress jitters on the transmitter clock signal.

2. The clock control device of claim 1, further comprising:
    a second phase interpolator circuit configured to generate the transmitter clock signal according to the second control signal and the at least one first reference clock signal.

3. The clock control device of claim 1, further comprising:
    a second phase interpolator circuit configured to generate a third reference clock signal according to the second control signal and the at least one first reference clock signal,
    wherein the transmitter circuit comprises a phase locked loop circuit, and the phase locked loop circuit is configured to generate the transmitter clock signal according to the third reference clock signal.

4. The clock control device of claim 1, wherein the transmitter circuit comprises a phase locked loop circuit, the phase locked loop circuit comprises a frequency divider circuit, and the frequency divider circuit is configured to set a division ratio according to the second control signal to generate the transmitter clock signal.

5. The clock control device of claim 1, wherein the transmitter circuit comprises a phase locked loop circuit, the phase locked loop circuit comprises a second phase interpolator circuit, and the second phase interpolator circuit is configured to generate the transmitter clock signal according to the second control signal.

6. The clock control device of claim 1, wherein the detector circuit is a phase detector circuit, a frequency detector, or a phase frequency detector circuit.

7. The clock control device of claim 1, wherein the digital controller circuitry comprises:
    a first filter circuit configured to filter the error signal, in order to generate a first signal;
    a first integrator circuit configured to accumulate the first signal to generate the first control signal;
    a second filter circuit configured to filter a second difference between the first signal and a second signal, in order to generate the second signal; and
    a second integrator circuit configured to accumulate the second signal, in order to generate the second control signal.

8. The clock control device of claim 7, wherein the second filter circuit is configured to subtract the second signal from the first signal to determine the second difference, and to update the second signal based on the second difference, in order to update the second signal based on the change of the first control signal.

9. The clock control device of claim 7, wherein the first filter circuit comprises:
    a first multiplier circuit configured to multiply a first coefficient with the error signal to generate a third signal;
    a first sigma delta modulator circuit configured to modulate the error signal to generate a fourth signal;
    a second multiplier circuit configured to multiply a second coefficient with the fourth signal to generate a fifth signal;
    a sub-integrator circuit configured to accumulate the fifth signal to generate a sixth signal;
    a second sigma delta modulator circuit configured to modulate the sixth signal to generate a seventh signal;
    an adder circuit configured to sum up the third signal and the seventh signal to generate an eighth signal; and
    a third sigma delta modulator circuit configured to modulate the eighth signal to generate the first signal.

10. The clock control device of claim 9, wherein the first sigma delta modulator circuit has a bypass mode and a modulation mode, when the first sigma delta modulator circuit operates in the modulation mode, the first sigma delta modulator circuit modulates the error signal to generate the fourth signal, and when the first signal delta modulator circuit operates in the bypass mode, the first sigma delta modulator circuit directly outputs the error signal to be the fourth signal.

11. The clock control device of claim 7, wherein the second filter circuit comprises:
    a subtractor circuit configured to subtract the second signal from the first signal, in order to generate a ninth signal;
    a multiplier circuit configured to multiply a coefficient with the ninth signal to generate a tenth signal;
    a sub-integrator circuit configured to accumulate the tenth signal to generate an eleventh signal; and
    a sigma delta modulator circuit configured to modulate the eleventh signal to generate the second signal.

12. The clock control device of claim 1, further comprising:
    a first frequency divider circuit configured to generate a plurality of first signals according to the at least one first reference clock signal, wherein the first phase interpolator circuit is further configured to generate the second reference clock signal according to the first control signal and the plurality of first signals;

a second frequency divider circuit configured to generate a second signal according to the second reference clock signal, wherein the detector circuit is further configured to determine the first difference according to the receiver clock signal and the second reference clock signal, in order to generate the error signal;

a third frequency divider circuit configured to generate a plurality of third signals according to the at least one first reference clock signal;

a second phase interpolator circuit configured to generate a fourth signal according to the plurality of third signals and the second control signal; and a fourth frequency divider circuit configured to generate the transmitter clock signal according to the fourth signal.

13. A clock control method, comprising:

generating a second reference clock signal according to a first control signal and at least one first reference clock signal;

generating an error signal according to a first difference between a receiver signal and the second reference clock signal, wherein the receiver signal is a receiver clock signal from a receiver circuit or an input signal that has been equalized by the receiver circuit; and generating, by a digital controller circuitry, the first control signal and a second control signal according to the error signal, and updating, by the digital controller circuitry, the second control signal according to a change of the first control signal, wherein the second control signal is for generating a transmitter clock signal of a transmitter circuit, and the digital controller circuitry is configured to reduce an update rate of the transmitter clock signal, in order to suppress jitters on the transmitter clock signal.

14. The clock control method of claim 13, further comprising:

generating the transmitter clock signal according to the second control signal and the at least one first reference clock signal.

15. The clock control method of claim 13, further comprising:

generating a third reference clock signal according to the second control signal and the at least one first reference clock signal, wherein the transmitter circuit comprises a phase locked loop circuit, and the phase locked loop circuit is configured to generate the transmitter clock signal according to the third reference clock signal.

16. The clock control method of claim 13, wherein the transmitter circuit comprises a phase locked loop circuit, the phase locked loop circuit comprises a frequency divider circuit, and the frequency divider circuit is configured to set a division ratio according to the second control signal to generate the transmitter clock signal.

17. The clock control method of claim 13, wherein the transmitter circuit comprises a phase locked loop circuit, the phase locked loop circuit comprises a phase interpolator circuit, and the phase interpolator circuit is configured to generate the transmitter clock signal according to the second control signal.

18. The clock control method of claim 13, wherein generating the first control signal and the second control signal according to the error signal comprises:

filtering the error signal, in order to generate a first signal;

accumulating the first signal to generate the first control signal;

filtering a second difference between the first signal and a second signal, in order to generate the second signal; and accumulating the second signal, in order to generate the second control signal.

19. The clock control method of claim 18, wherein filtering the second difference between the first signal and the second signal, in order to generate the second signal comprises:

subtracting the second signal from the first signal to determine the second difference; and updating the second signal based on the second difference, in order to update the second signal based on the change of the first control signal.

20. A clock control device, comprising:

a first phase interpolator circuit configured to generate a second reference clock signal according to a first control signal and at least one first reference clock signal;

a detector circuit configured to generate an error signal according to a first difference between a receiver signal and the second reference clock signal, wherein the receiver signal is a receiver clock signal from a receiver circuit or an input signal that has been equalized by the receiver circuit; and a digital controller circuitry configured to generate the first control signal and a second control signal according to the error signal, and to update the second control signal according to a change of the first control signal, wherein the second control signal is for generating a transmitter clock signal of a transmitter circuit, and the digital controller circuitry comprises:

a first filter circuit configured to filter the error signal, in order to generate a first signal;

a first integrator circuit configured to accumulate the first signal to generate the first control signal;

a second filter circuit configured to filter a second difference between the first signal and a second signal, in order to generate the second signal; and a second integrator circuit configured to accumulate the second signal, in order to generate the second control signal.

* * * * *